US012765083B2

(12) United States Patent
Hsieh et al.

(10) Patent No.: US 12,765,083 B2
(45) Date of Patent: Oct. 13, 2026

(54) IMAGE SENSING STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Feng-Chien Hsieh, Pingtung County (TW); Yun-Wei Cheng, Taipei City (TW); Wei-Li Hu, Tainan City (TW); Kuo-Cheng Lee, Tainan City (TW); Cheng-Ming Wu, Tainan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 579 days.

(21) Appl. No.: 18/150,806

(22) Filed: Jan. 6, 2023

(65) Prior Publication Data

US 2024/0096923 A1 Mar. 21, 2024

Related U.S. Application Data

(60) Provisional application No. 63/375,855, filed on Sep. 16, 2022.

(51) Int. Cl.
*H10F 39/18* (2025.01)
*H10F 39/00* (2025.01)

(52) U.S. Cl.
CPC ......... *H10F 39/18* (2025.01); *H10F 39/8027* (2025.01); *H10F 39/014* (2025.01)

(58) Field of Classification Search
CPC .... H10F 39/18; H10F 39/8027; H10F 39/014; H10F 39/018; H10F 39/199; H10F 39/809; H10F 39/811; H10F 39/813
See application file for complete search history.

(56) References Cited

U.S. PATENT DOCUMENTS

2006/0175536 A1* 8/2006 Kim ...................... H10F 39/813 348/E3.018
2015/0372042 A1* 12/2015 Wan .................... H10F 39/8053 257/432
2016/0020235 A1* 1/2016 Yamashita ............ H10F 39/811 250/206
2018/0227528 A1* 8/2018 Johnson ................. H04N 25/77
2024/0047501 A1* 2/2024 Shim ....................... H10F 39/18

* cited by examiner

*Primary Examiner* — Tucker J Wright
(74) *Attorney, Agent, or Firm* — WPAT LAW; Anthony King

(57) ABSTRACT

The image sensing structure includes a first semiconductor device and a second semiconductor device. The first semiconductor device includes at least one first unit. The at least one first unit includes a plurality of first interconnects adjacent to the top side of the first semiconductor device, a row selector, and an analog-to-digital converter (ADC) connected to the row selectors. The second semiconductor device includes at least one second unit. The at least one second unit includes a photodiode facing the top side of the second semiconductor device. The photodiode is configured to receive the light incident on the top side of the second semiconductor device. The top side of the first semiconductor device is bonded to the bottom side of the second semiconductor device.

20 Claims, 13 Drawing Sheets

IMAGE SENSING STRUCTURE AND METHOD FOR MANUFACTURING THE SAME

PRIORITY CLAIM AND CROSS-REFERENCE

This application claims the benefit of prior-filed provisional application No. 63/375,855, filed on Sep. 16, 2022.

TECHNICAL FIELD

The present disclosure relates to an image sensing structure, and to an image sensing structure including two semiconductor devices bonded by pixel level hybrid bonding.

BACKGROUND

In an image sensing structure, pixel areas become more important as sensor device size is decreased. Increasing the pixel areas is important and needed. In addition, the image sensing structure includes a complementary metal-oxide-semiconductor (CMOS) image sensor (CIS) to receive or collect optical information (e.g. light, images, or patterns). However, the received optical information may include some unwanted signals (e.g., image distortion due to charging effect). Therefore, an improved image sensing structure is needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
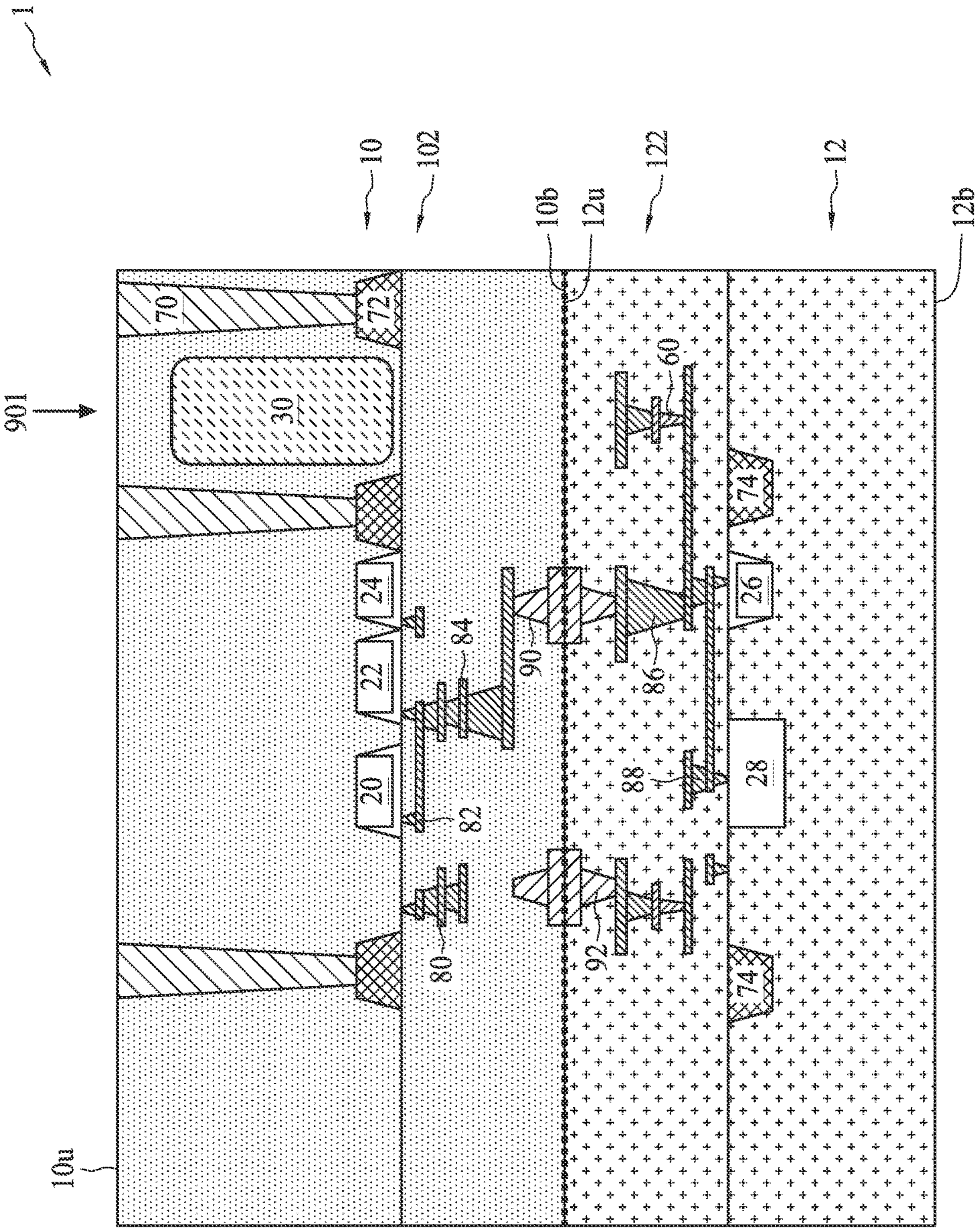
FIG. 1 is a diagram of an image sensing structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as “first,” “second” and “third” describe various elements, components, regions, layers and/or sections, these elements, components, regions, layers and/or sections should not be limited by these terms. These terms may only be used to distinguish one element, component, region, layer or section from another. Terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” and “about” generally mean within a value or range that can be contemplated by people having ordinary skill in the art. Alternatively, the terms “substantially,” “approximately” and “about” mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In conventional image sensing structure, received optical information may include unwanted content (e.g., image distortion due to charging effect). Therefore, an improved image sensing structure is needed. The present disclosure describes a solid-state CMOS image sensor array and in particular describes an image sensor array pixels having a global shutter capabilities. The charges are transferred from a photodiode to a transfer gate. In contrast to the rolling shutter capabilities, the global shutter capabilities do not include the image distortion caused by the rolling shutter scanning. In order to increase the pixel areas, a row selector is moved to the application specific integrated circuit (ASIC) chip to reduce the sensor/pixel areas. In addition, an analog-to-digital converter (ADC) circuit is connected to the corresponding row selector and corresponding pixel through pixel level hybrid bonding for immediate signal transfer.

FIG. 1 is a diagram of an image sensing structure 1 in accordance with some embodiments of the present disclosure. FIG. 1 shows an image sensing structure 1. The image sensing structure 1 includes a first semiconductor device 12 and a second semiconductor device 10. In some embodiments, the first semiconductor device 12 may include a semiconductor substrate which includes several materials such as silicon, GaAs, germanium, silicon on insulator (SOI), or other suitable semiconductor materials. In some embodiments, in the semiconductor substrate as shown, some features have been omitted for simplification. For example, the semiconductor substrate may include transistors or other electric components such as resistors, diodes, and etc.

In some embodiments, the first semiconductor device 12 includes a top side **12*u* and a bottom side 12*b* opposite to the top side 12*u* of the first semiconductor device 12. In some embodiments, the first semiconductor device 12 includes at least one first unit 122. In some embodiments, the first unit 122 includes a plurality of interconnects 86, 88, and 92 adjacent to the top side 12*u* of the first semiconductor device 12. In some embodiments, the first unit 122 includes a row selector 26 electrically connected to the plurality of interconnects 86, 88, and 92. In some embodiments, the first unit 122 includes an analog-to-digital converter (ADC) 28 electrically connected to the row selectors 26. In some embodiments, the first semiconductor device 12 includes a plurality of first units 122. Each of the plurality of first units 122 includes a plurality of first interconnects 86, 88, and 92 adjacent to the top side 12*u* of the first semiconductor device 12; and a row selector 26 connected to the plurality of first interconnects 86, 88, and 92. In some embodiments, the ADCs 28 are correspondingly connected to the plurality of first units 122**.

In some embodiments, the second semiconductor device 10 includes a top side **10*u* and a bottom side 10*b* opposite to the top side 10*u* of the second semiconductor device 10. The bottom side 10*b* faces the top side 12*u* of the first semiconductor device 12. In some embodiments, the second semiconductor device 10 includes at least one second unit 102. The second unit 102 includes a photodiode 30 facing the top side 10*u* of the second semiconductor device 10. The second unit 102 is configured to receive light incident on the top side 10*u* of the second semiconductor device 10. The top side 12*u* of the first semiconductor device 12 is bonded to the bottom side 10*b* of the second semiconductor device 10**.

In some embodiments, the top side **12*u* of the first semiconductor device 12 is bonded to the bottom side 10*b* of the second semiconductor device 10 through pixel level hybrid bonding 90 such that one first unit 122 of the first semiconductor device 12 corresponds to one or more second units 102 of the second semiconductor device 10. In some embodiments, the second semiconductor device 10 includes a photo sensor chip. In some embodiments, the first semiconductor device 12 includes an application specific integrated circuit (ASIC) chip. In some embodiments, the second semiconductor device 10** includes a plurality of pixels.

In some embodiments, the first unit 122 includes a plurality of 3D metal insulator metal (MIM) structures 60. The plurality of 3D MIM structures 60 are configured to store signals detected by the photodiode 30. In some embodiments, the 3D MIM structures 60 may be integrated in series to be a storage device for high capacitance storage. Conductive materials are used in the formation of storage cell capacitors and also may be used in interconnection structures, for example, conductive layers in contact holes, vias, etc. Generally, various metals and metallic compounds, and typically noble metals, such as platinum, have been proposed as the electrodes or at least one of the layers of electrodes for use with high dielectric constant materials as insulators for high dielectric MIM storage cell capacitors. In some embodiments, the 3D MIM structures 60 store the signals from the second semiconductor device 10 and transfer the signals to the row selector 26 and the ADC 28.

The photodiode 30 of the second unit 102 corresponds to one pixel of the second semiconductor device 10. A light signal detected by the photodiode 30 of the second unit 102 is merely transferred to one corresponding row selector 26 and one corresponding ADC 28 of the at least one first unit 122. In some embodiments, the light signals generated by a plurality of photodiodes 30 are transmitted to one corresponding row selector 26 and one corresponding ADC 28.

The photodiode 30 of the at least one second unit 102 is directly electrically connected to one corresponding row selector 26 of the at least one first unit 122 through pixel level hybrid bonding 90. The first semiconductor device 12 and the second semiconductor device 10 is bonded to each other through pixel level hybrid bonding 90 and 92. The second semiconductor device 10 includes a large second unit 102 including a bonding contact of pixel level hybrid bonding 90. The first semiconductor device 12 includes a plurality of first units 122 including a bonding contact of pixel level hybrid bonding 92. The pixel level hybrid bonding 90 and 92 may be a pixel-level joint of the units or an inter-wafer bonding of the units.

The at least one second unit 102 of the second semiconductor device 10 further comprises a transfer gate 22 configured to transfer the charges from the photodiode 30. In some embodiments, the transfer gate 22 is used as a CMOS switch. In some embodiments, the second unit 102 of the second semiconductor device 10 includes a reset transistor 24 connected to the transfer gate 22. The reset transistor 24 and the transfer gate 22 share a common n-plus doped region disposed between the reset transistor 24 and the transfer gate 22. In some embodiments, the elements of the first semiconductor device 12 are all manufactured on the same integrated circuit board. In some embodiments, the elements of the second semiconductor device 10 are all manufactured on the same integrated circuit board. For the plurality of second interconnects 80, 82, 84 and 90, this requires some active areas to be kept near each photodiode 30. As cameras or optical devices become smaller, in order to accommodate thin devices (such as mobile phones) and market demand for increased pixel counts, smaller surface areas are allowed for each photodiode 30. Since the signal depends on the photons received by each photodiode 30, it is desirable to maximize the ratio of the area of the second semiconductor device 10 dedicated to the photodiode 30 to maintain sensitivity. After charge to voltage conversion is completed and the signal transferred out from the photodiodes 30, the photodiodes are reset in order to be ready for accumulation of new charge. In some embodiments, a scheme for reading a signal from the photodiode 30 includes a rolling shutter scheme for successively reading a plurality of signals generated by a plurality of photodiodes 30 for each row. In some embodiments, all photodiodes 30 are exposed to light and a global shutter scheme successively reads a plurality of signals generated by a plurality of photodiodes 30. In the global shutter scheme, all photodiodes 30 are collectively exposed to light for a period of time.

In some embodiments, the photodiode 30 generates charges in response to incident light 901. In some embodiments, the photodiode 30 may be included in a pixel circuit. Each pixel circuit includes a photoelectric conversion element (photodiode 30) for outputting a current at a value in accordance with a quantity of incident light 901. In some embodiments, the reset transistor 24 resets a node to a predetermined voltage when a time period starts.

The transfer gate 22 transmits the charges stored in the photodiode 30 to a sensing node (not shown) and the reset transistor 24 coupled to a power supply voltage. The reset transistor 24 resets a voltage of the sensing node so that the sensing node has substantially a level of the power supply voltage. The source follower 20 amplifies the voltage of the sensing node. The row selector 26 transmits a voltage of a source electrode of the source follower 20 into an internal circuit in response to a selection signal. The row selector 26 is added into the first semiconductor device 12 to control the signal from the second semiconductor device 10 used as a pixel circuit. The row selector 26 is engaged in switching operation in order to correspond to a specific photodiode 30 for signal transfer. The row selector 26 selects a corresponding row for selecting a signal during the time period at a level in accordance with a voltage of the node charged with an output current from the photodiode 30.

The second unit 102 of the second semiconductor device 10 includes a source follower 20. The source follower 20 and the reset transistor 24 share a common n-plus doped region disposed between the source follower 20 and the reset transistor 24. In some embodiments, the source follower 20 may be a common drain amplifier. The source follower 20 is a circuit configuration of an active device that is used in circuit designs to provide a voltage buffer or to transform impedances. In some embodiments, the source follower 20 may be a fingered type source follower transistor. In some embodiments, a CMOS source follower circuit provides the high input impedance, moderate current gain, low output impedance and a voltage gain approaching one. Such an active device can be fabricated using the CMOS 40 nanometer (nm) technology designed to operate at a VDD of 1.2V. The source follower 20 may be used as an amplifier which can be formed from two series stacked devices, wherein one device translates the input signal (active device), while the second device is the load (load device). A light 901 received by the photodiode 30 and the photons are converted into electrons that are integrated (collected) in a sensor pixel/photodiode 30. After completion of the integration cycle, collected charge is converted to a voltage, which is supplied to the output terminals of the second unit 102 used as an optical sensor. In a CMOS image sensor, the charge to voltage conversion is accomplished directly in the pixels themselves and the analog pixel voltage is transferred to the output terminals through various pixel arrangement and scanning schemes. The analog signal can also be converted on-chip to a digital equivalent before reaching the chip output. The pixels/photodiodes transfer the analog signal to a buffer amplifier (such as the source follower 20. In some embodiments, the source follower 20 drives a detection line connected to the pixels by suitable addressing transistors. In some embodiments, the source follower 20 may also be used in an addressing function.

In some embodiments, the source follower 20 may be formed by placing two series stacked n-channel (NMOS) devices coupled between the voltage VDD and the ground (GRD) with the lower device presenting a controlled current load to the upper device that is driven by the input. If the supply voltage (VDD-GRD) is 1.2V, an output signal swing is an important concern. In some embodiments, the source follower 20 generates an output signal with a maximum voltage swing of 400 mV to 500 mV. The source voltage of the source follower 20 is output as an output voltage VOUT to the internal circuit. Then, a reset operation of the reset transistor 24 is repeated.

Figure 2:
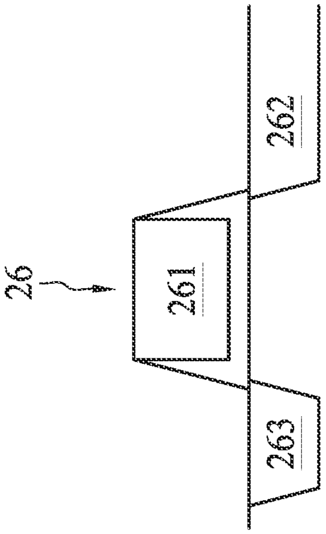
FIG. 2 is a diagram of a row selector in accordance with some embodiments of the present disclosure.

FIG. 2 is a diagram of a row selector 26 in accordance with some embodiments of the present disclosure. The row selector 26 includes a gate 261, a common n-plus doped region 263, and an output 262. The row selector 26 is electrically connected to the plurality of interconnects 86, 88, and 92. In some embodiments, the ADC 28 is electrically connected to the row selectors 26. In some embodiments, the 3D MIM structures 60 of the first semiconductor device 12 stores the signals from the second semiconductor device 10 and transfers the signals to the row selector 26 and the ADC 28. In some embodiments, a light signal detected by one photodiode 30 is merely transferred to one corresponding row selector 26 of the at least one second unit 102. In some embodiments, a light signal detected by one photodiode 30 is merely transferred to one corresponding ADC 28 of the at least one first unit 122. In some embodiments, the light signals generated by a plurality of photodiodes 30 are transmitted to one corresponding row selector 26 and one corresponding ADC 28. That is, a plurality of photodiodes 30 correspond to one row selector 26 and one ADC 28. One photodiode 30 of the at least one second unit 102 is directly bonded to one corresponding row selector 26 of the at least one first unit 122 through pixel level hybrid bonding 90 and 92.

In some embodiments, the row selector 26 transmits a voltage of the source follower 20 to an internal circuit. The row selector 26 is added to the first semiconductor device 12 to control the signal from the second semiconductor device 10 used as a pixel circuit or optical sensor. The row selector 26 corresponds to a specific photodiode 30 for signal transfer. The row selector 26 selects a corresponding row for selecting a signal during the time period at a level in accordance with a voltage of the node charged with an output current from the photodiode 30. In some embodiments, the light signals generated by a plurality of photodiodes 30 are transmitted to one corresponding row selector 26 and one corresponding ADC 28.

Figure 3:
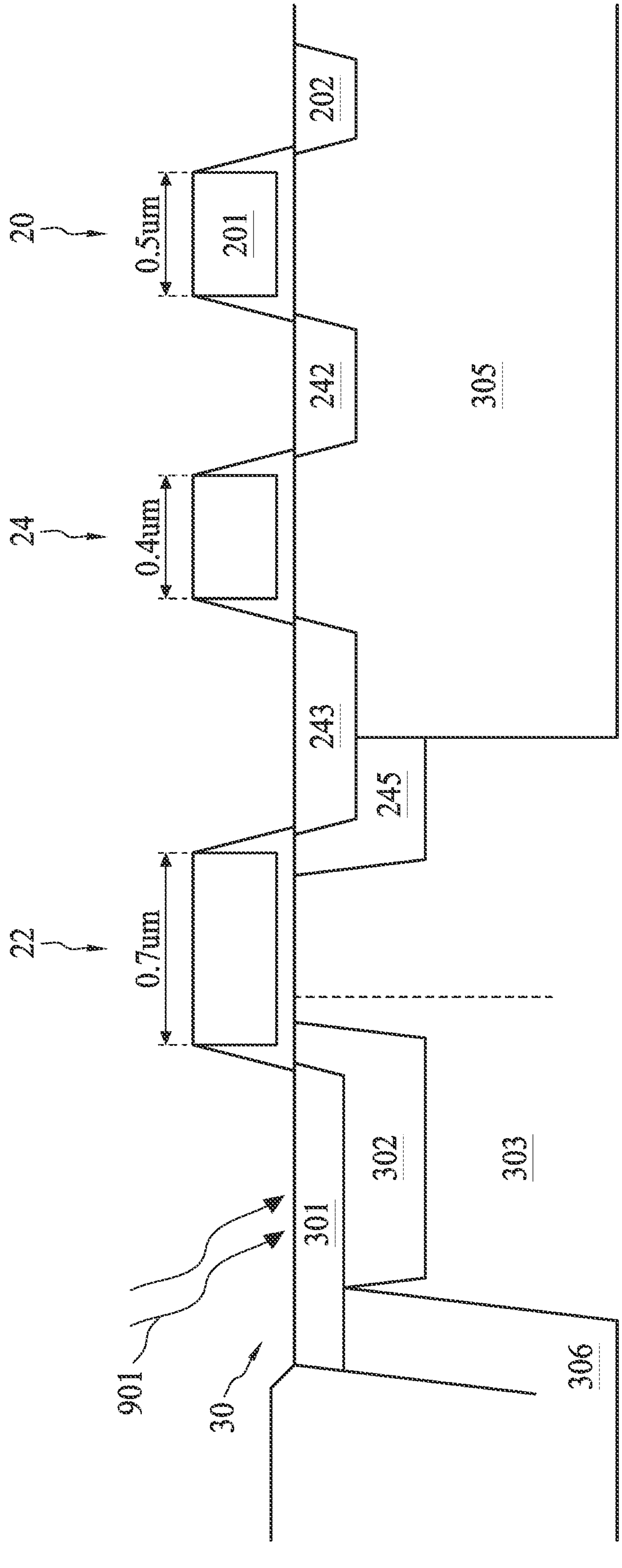
FIG. 3 is a diagram of the structure of a transfer gate, a reset transistor, and a source follower in accordance with some embodiments of the present disclosure.

FIG. 3 is a diagram of the structure of the transfer gate 22, reset transistor 24, and source follower 20 in accordance with some embodiments of the present disclosure. The photodiode 30 includes a p type doped region 301 and a n type doped region 302. In some embodiments, the photodiode 30 generates charges in response to incident light 901. The photodiode 30 is disposed on a p type substrate 303 and a p type well 302. The width of the transfer gate 22 is approximately 0.7 micrometers (μm). The width of the reset transistor 24 is approximately 0.4 μm. The width of the source follower 20 is approximately 0.5 μm. In some embodiments, the source follower 20 amplifies the voltage of a sensing node. In some embodiments, the source follower 20 may be a common drain amplifier. The source follower 20 is a circuit configuration of an active device that is used in circuit designs to provide a voltage buffer or to transform impedances. In some embodiments, the source follower 20 may be a fingered type source follower transistor. In some embodiments, a CMOS source follower circuit provides the high input impedance, moderate current gain, low output impedance and a voltage gain approaching one. The source follower 20 may be used as an amplifier which can be formed from two series stacked devices, wherein one device translates the input signal (active device), while the second device is the load (load device). The pixels/photodiodes transfer the analog signal to a buffer amplifier (such as the source follower 20. In some embodiments, the source follower 20 drives a sense line that are connected to the pixels by suitable addressing transistors. In some embodiments, the source follower 20 may also be used in an addressing function. In some embodiments, the source follower 20 generates an output signal with a maximum voltage swing of 400 mV to 500 mV. The source voltage of the source follower 20 is output as an output voltage VOUT to the internal circuit.

In some embodiments, the reset transistor 24 is connected to the transfer gate 22. The reset transistor 24 and the transfer gate 22 share a common n-plus doped region 243 disposed between the reset transistor 24 and the transfer gate 22. The reset transistor 24 and the source follower 20 share a common n-plus doped region 242 disposed between the reset transistor 24 and the source follower 20. The reset transistor 24 and the source follower 20 is disposed on a p well 305. The common n-plus doped region 243 is disposed on a n doped region 245. The transfer gate 22 is configured to transfer the charges from the photodiode 30. In some embodiments, the transfer gate 22 is used as a CMOS switch. The transfer gate 22 transmits the charges stored in the photodiode 30. In some embodiments, the reset transistor 24 resets a node to a predetermined voltage when a time period starts. The reset transistor 24 resets a voltage of a sensing node so that the sensing node has substantially a level of the power supply voltage.

Figure 4:
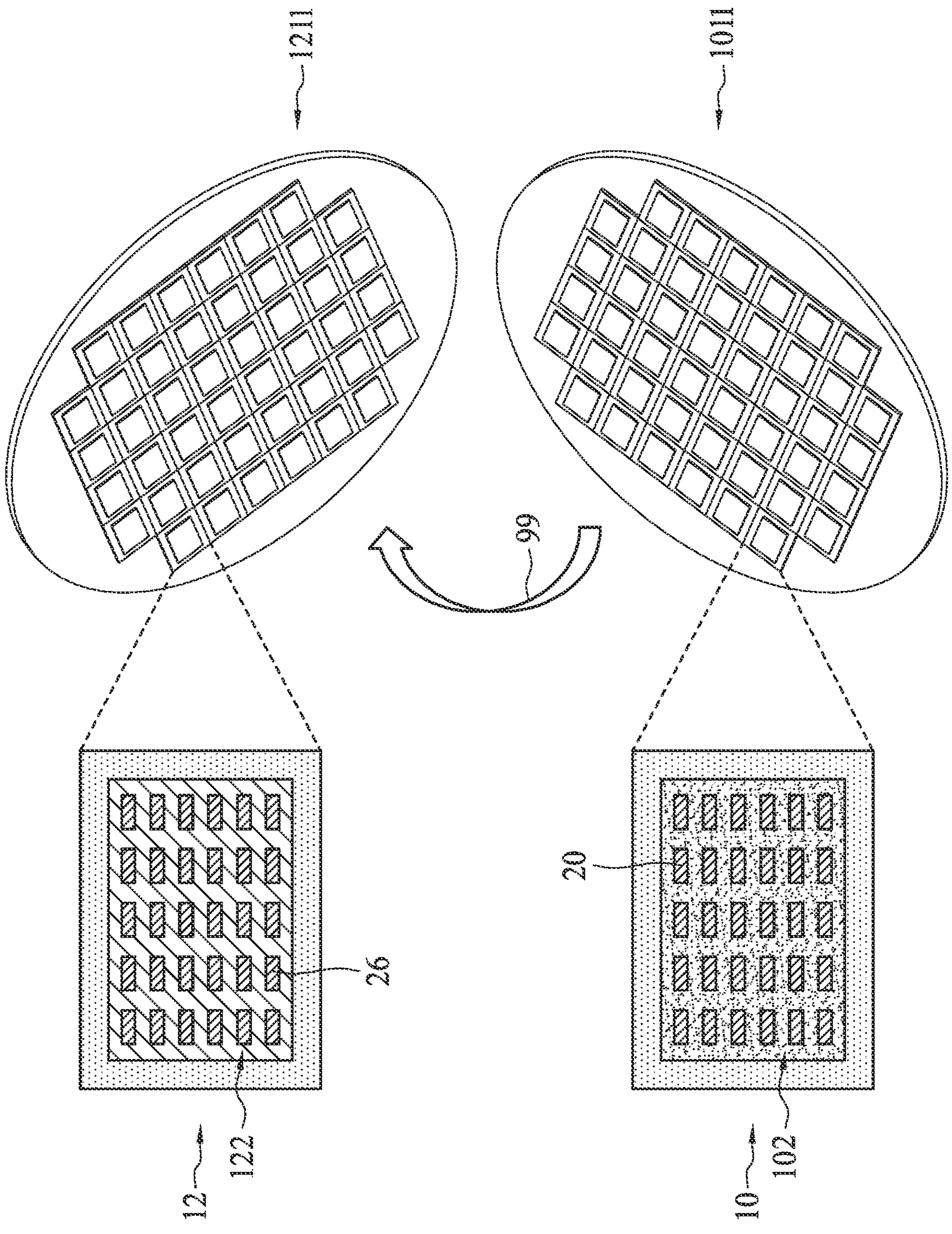
FIG. 4 illustrates a method for manufacturing an image sensing structure in accordance with some embodiments of the present disclosure.

FIG. 4 illustrates a method for manufacturing an image sensing structure 1 in accordance with some embodiments of the present disclosure. The method includes forming a plurality of first semiconductor devices 12 on a wafer 1211 and forming a plurality of second semiconductor devices 10 on a wafer 1011. The first semiconductor devices 12 includes a plurality of first units 122. Each of the first units 122 comprises a row selector 26 and an ADC 28. The second semiconductor device 10 comprises a plurality of second units 102. Each of the second units 102 includes a source follower 20. The bottom side of the second semiconductor device 10 is bonded to the top side of the second semiconductor device 12 through wafer-level bonding (e.g., the pixel level hybrid bonding 90 and 92) such that one first unit 122 of the first semiconductor device 12 corresponds to one second unit 102 of the second semiconductor device 10. The bottom side of the second semiconductor device 10 is bonded to the top side of the second semiconductor device 12 through pixel level hybrid bonding 90 such that one first unit 122 of the first semiconductor device 12 corresponds to a plurality second units 102 of the second semiconductor device 10. The second semiconductor device 10 includes a photo sensor chip and the first semiconductor device 12 includes an ASIC chip.

Figure 5:
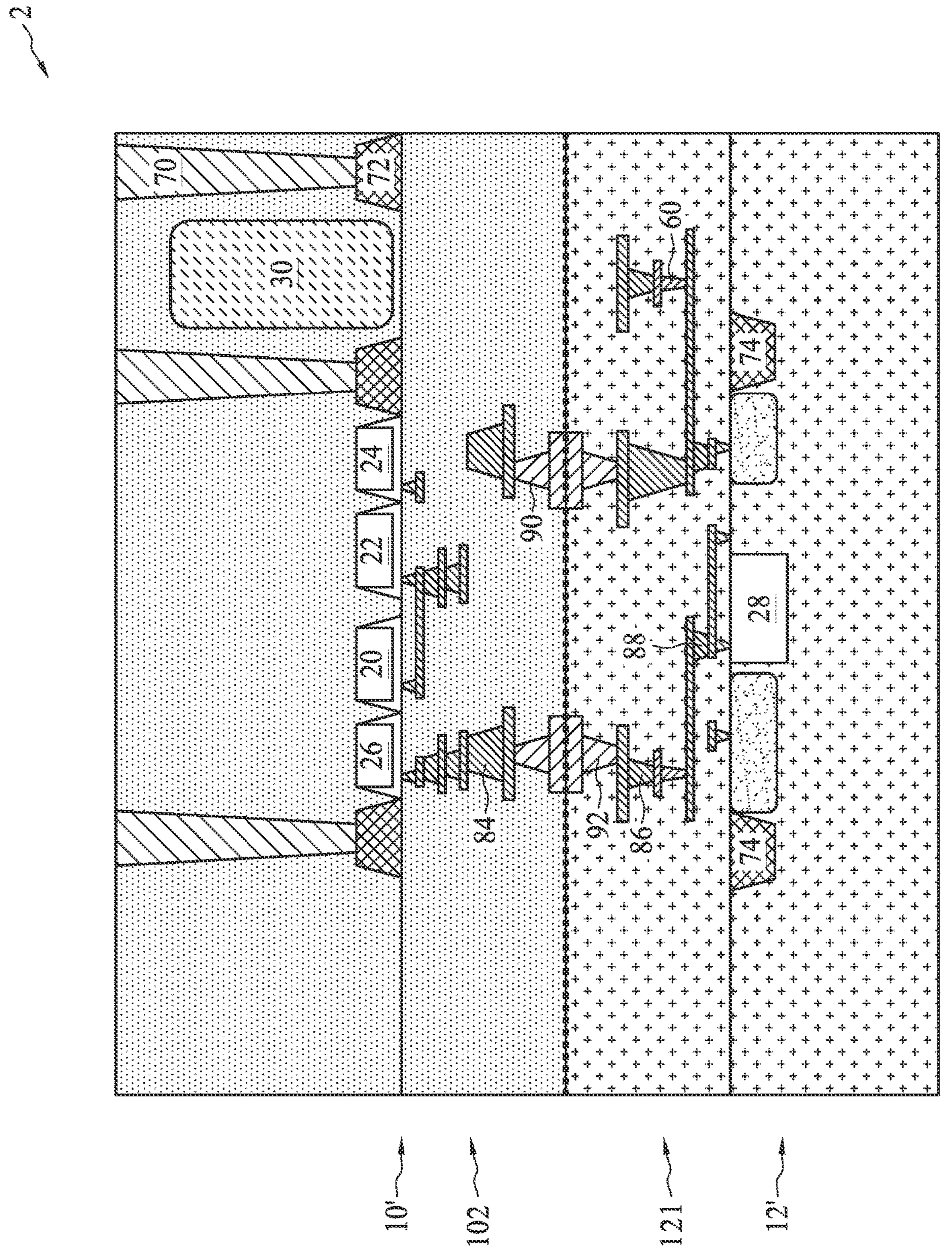
FIG. 5 is a diagram of an image sensing structure in accordance with some embodiments of the present disclosure.

FIG. 5 is a diagram of an image sensing structure 2 in accordance with some embodiments of the present disclosure. FIG. 5 shows an image sensing structure 2. The image sensing structure 2 includes a first semiconductor device 12' and a second semiconductor device 10'. In some embodiments, the first semiconductor device 12' may include a semiconductor substrate which includes several materials such as silicon, GaAs, germanium, SOI, or other suitable semiconductor materials. In some embodiments, in the semiconductor substrate as shown, some features have been omitted for simplification. For example, the semiconductor substrate may include transistors or other electric components such as resistors, diodes, etc.

In some embodiments, the first semiconductor device 12' includes a top side **12*u* and a bottom side 12*b* opposite to the top side 12*u* of the first semiconductor device 12'. In some embodiments, the first semiconductor device 12' includes one first unit 121. In some embodiments, the first unit 121 includes a plurality of interconnects 86, 88, and 92 adjacent to the top side 12*u* of the first semiconductor device 12'. In some embodiments, the second unit 102 includes a row selector 26 electrically connected to the plurality of interconnects 84. In some embodiments, the first unit 121 includes a plurality of ADCs 28. The first unit 121 includes a plurality of first interconnects 86, 88, and 92 adjacent to the top side 12*u* of the first semiconductor device 12'**.

In some embodiments, the second semiconductor device 10' includes a top side **10*u* and a bottom side 10*b* opposite to the top side 10*u* of the second semiconductor device 10'. The bottom side 10*b* faces the top side 12*u* of the first semiconductor device 12'. In some embodiments, the second semiconductor device 10' includes at least one second unit 102. The second unit 102 includes a photodiode 30 facing the top side 10*u* of the second semiconductor device 10'. The second unit 102 is configured to receive the light incident on the top side 10*u* of the second semiconductor device 10'. The top side 12*u* of the first semiconductor device 12' is bonded to the bottom side 10*b* of the second semiconductor device 10'**.

In some embodiments, the top side **12*u* of the first semiconductor device 12' is bonded to the bottom side 10*b* of the second semiconductor device 10' through pixel level hybrid bonding 90 such that one first unit 121 of the first semiconductor device 12' corresponds to a plurality of second units 102 of the second semiconductor device 10'. In some embodiments, the second semiconductor device 10' includes a photo sensor chip. In some embodiments, the first semiconductor device 12' includes an ASIC chip. In some embodiments, the second semiconductor device 10'** includes a plurality of pixels.

In some embodiments, the first unit 121 includes a plurality of 3D MIM structures 60. The plurality of 3D MIM structures 60 are configured to store signals detected by the photodiode 30. In some embodiments, the 3D MIM structures 60 may be integrated in series to be a storage device for high capacitance storage. Conductive materials are used in the formation of storage cell capacitors and also may be used in interconnection structures, for example, conductive layers in contact holes, vias, etc. Generally, various metals and metallic compounds, and typically noble metals, such as platinum, have been proposed as the electrodes or at least one of the layers of electrodes for use with high dielectric constant materials as insulators for high dielectric MIM storage cell capacitors. In some embodiments, the 3D MIM structures 60 stores the signals from the second semiconductor device 10' and transfers the signals to the ADC 28.

The photodiode 30 of the second unit 102 corresponds to one pixel of the second semiconductor device 10'. A light signal detected by the photodiode 30 of the second unit 102 is transferred to the row selectors 26 of the second unit 102 and the ADCs 28 of the first unit 121. In some embodiments, the light signals generated by a plurality of photodiodes 30 are transmitted to the row selector 26 of the second unit 102.

The photodiode 30 of the at least one second unit 102 is electrically connected to the row selector 26 of the at least one second unit 101. The first semiconductor device 12' and the second semiconductor device 10' are bonded to each other through the pixel level hybrid bonding 90 and 92. The second semiconductor device 10' includes a plurality of second units 102 including a bonding contact of pixel level hybrid bonding 90. The first semiconductor device 12' includes one first unit 121 including a bonding contact of pixel level hybrid bonding 92. The pixel level hybrid bonding 90 and 92 may be a pixel-level joint of the units or an inter-wafer bonding of the units.

The at least one second unit 102 of the second semiconductor device 10' further comprises a transfer gate 22 configured to transfer the charges from the photodiode 30. In some embodiments, the transfer gate 22 is used as a CMOS switch. In some embodiments, the second unit 102 of the second semiconductor device 10' includes a reset transistor 24 connected to the transfer gate 22. The reset transistor 24 and the transfer gate 22 share a common n-plus doped region disposed between the reset transistor 24 and the transfer gate 22. In some embodiments, the elements of the first semiconductor device 12' are all manufactured on the same integrated circuit board. In some embodiments, the elements of the second semiconductor device 10' are all manufactured on the same integrated circuit board. For the plurality of second interconnects 84 and 90, this requires active areas near each photodiode 30. As cameras and optical devices become smaller, in order to accommodate thin devices (such as mobile phones) and market demands for increased pixel counts, smaller surface areas are allowed for each photodiode 30. Since the signal depends on the photons received by each photodiode 30, it is desirable to maximize the ratio of the area of the second semiconductor device 10' dedicated to the photodiode 30 to maintain sensitivity. After charge to voltage conversion is completed and the signal transferred out from the photodiodes 30, the photodiodes are reset in order to be ready for accumulation of new charge. In some embodiments, a scheme for reading a signal from the photodiode 30 includes a rolling shutter scheme for successively reading a plurality of signals generated by a plurality of photodiodes 30 for each row.

In some embodiments, the photodiode 30 generates charges in response to incident light 901. In some embodiments, the photodiode 30 may be include in a pixel circuit. Each pixel circuit includes a photoelectric conversion element (photodiode 30) for outputting a current at a value in accordance with a quantity of incident light 901. In some embodiments, the reset transistor 24 resets a node to a predetermined voltage when a time period starts.

The transfer gate 22 transmits the charges stored in the photodiode 30 to a sensing node (not shown) and the reset transistor 24 coupled to a power supply voltage. The reset transistor 24 resets a voltage of the sensing node so that the sensing node has substantially a level of the power supply voltage. The source follower 20 amplifies the voltage of the sensing node. The row selector 26 transmits a voltage of a source electrode of the source follower 20 to an internal circuit in response to a selection signal. The row selector 26 is added to the first semiconductor device 12' to control the signal from the second semiconductor device 10' used as a pixel circuit. The row selector 26 is engaged in switching operation in order to correspond to a specific photodiode 30 for signal transfer. The row selector 26 selects a corresponding row for selecting a signal during the time period at a level in accordance with a voltage of the node charged with an output current from the photodiode 30.

The second unit 102 of the second semiconductor device 10' includes a source follower 20. The source follower 20 and the reset transistor 24 share a common n-plus doped region disposed between the source follower 20 and the reset transistor 24. In some embodiments, the source follower 20 may be a common drain amplifier. The source follower 20 is a circuit configuration of an active device that is used in circuit designs to provide a voltage buffer or to transform impedances. In some embodiments, the source follower 20 may be a fingered type source follower transistor. In some embodiments, a CMOS source follower circuit provides the high input impedance, moderate current gain, low output impedance and a voltage gain approaching one. Such an active device can be fabricated using the CMOS 40 nm technology designed to operate at a VDD of 1.2V. The source follower 20 may be used as an amplifier which can be formed from two series stacked devices, wherein one device translates the input signal (active device), while the second device is the load (load device). A light 901 received by the photodiode 30 and the photons are converted into electrons that are integrated (collected) in a sensor pixel/photodiode 30. After completion of the integration cycle, collected charge is converted to a voltage, which is supplied to the output terminals of the second unit 102 used as an optical sensor. In a CMOS image sensor, the charge to voltage conversion is accomplished directly in the pixels themselves and the analog pixel voltage is transferred to the output terminals through various pixel arrangement and scanning schemes. The analog signal can also be converted on-chip to a digital equivalent before reaching the chip output. The pixels/photodiodes transfer the analog signal to a buffer amplifier (such as the source follower 20. In some embodiments, the source follower 20 drives a sense line that are connected to the pixels by suitable addressing transistors. In some embodiments, the source follower 20 may also be used in an addressing function.

In some embodiments, the source follower 20 may be formed by placing two series stacked n-channel (NMOS) devices coupled between the voltage VDD and the ground (GRD) with the lower device presenting a controlled current load to the upper device that is driven by the input. If the supply voltage (VDD-GRD) is 1.2V, an output signal swing is an important concern. In some embodiments, the source follower 20 generates an output signal with a maximum voltage swing of 400 mV to 500 mV. The source voltage of the source follower 20 is output as an output voltage VOUT to the internal circuit. Then, a reset operation of the reset transistor 24 is repeated.

Figure 6:
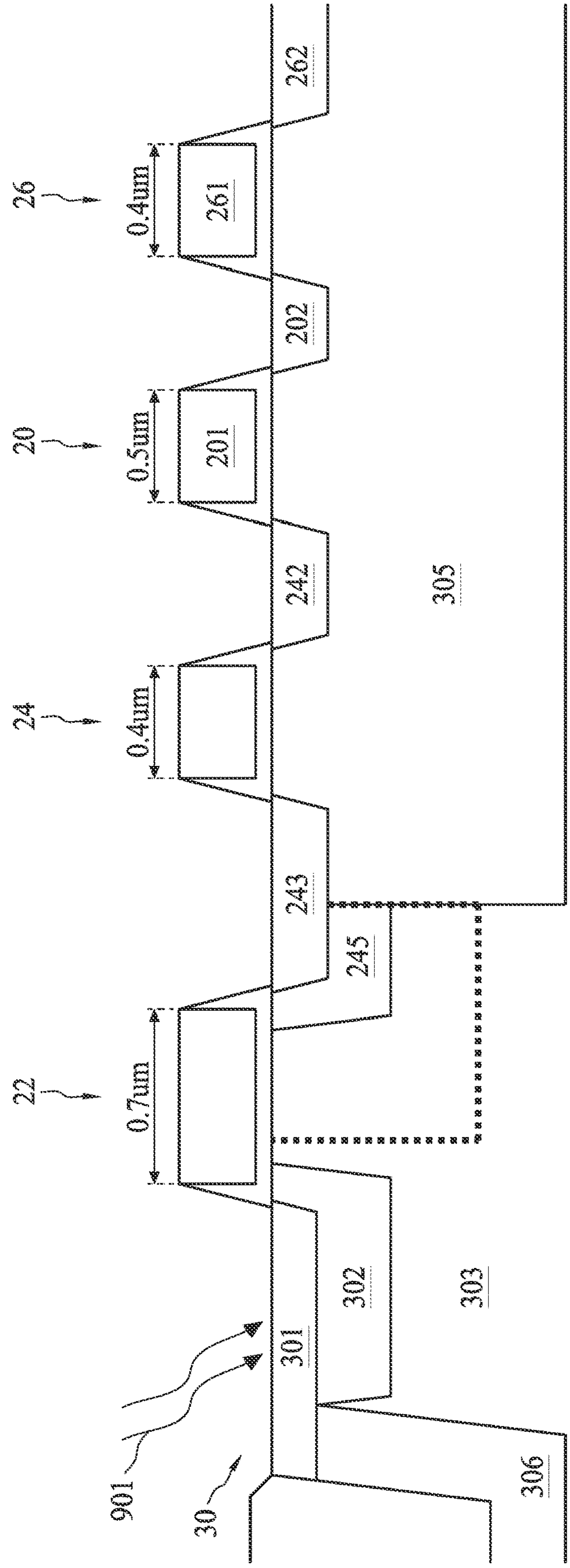
FIG. 6 is a diagram of the structure of a transfer gate, a reset transistor, a source follower, and a row selector in accordance with some embodiments of the present disclosure.

FIG. 6 is a diagram of the structure of the transfer gate 22, reset transistor 24, source follower 20, and row selector 26 in accordance with some embodiments of the present disclosure. The structure of FIG. 6 is similar to the structure of FIG. 3, except for the row selector 26. The photodiode 30 includes a p type doped region 301 and a n type doped region 302. In some embodiments, the photodiode 30 generates charges in response to incident light 901. The source follower 20 and the row selector 26 share a common n-plus doped region 202 disposed between the source follower 20 and the row selector 26. The row selector 26 includes an output 262 for outputting signals.

Figure 7:
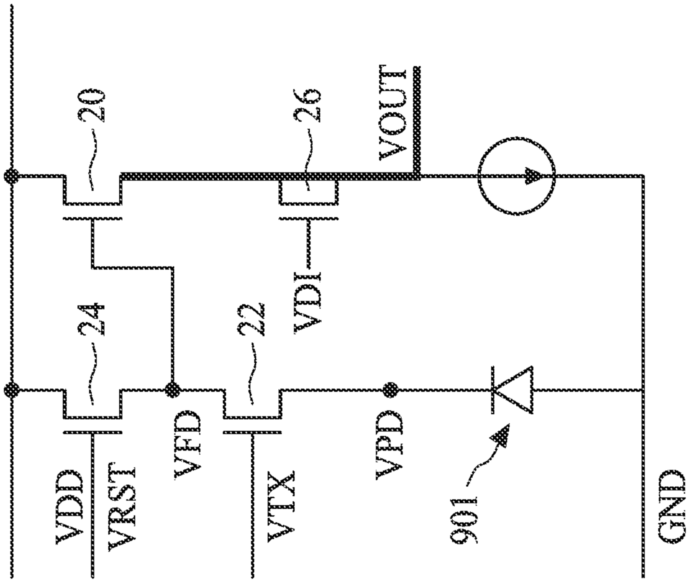
FIG. 7 is a circuit diagram of the structure of a transfer gate, a reset transistor, a source follower, and a row selector in accordance with some embodiments of the present disclosure.

FIG. 7 is a circuit diagram of the structure of the transfer gate 22, reset transistor 24, source follower 20, and row selector 26 in accordance with some embodiments of the present disclosure. In some embodiments, the light 901 is received by the photodiode 30 and the photons are converted into electrons that are integrated (collected) in the photodiode 30. The signal is transferred to the transfer gate 22. The signal is output from the row selector 26 as Vout.

Figure 8:
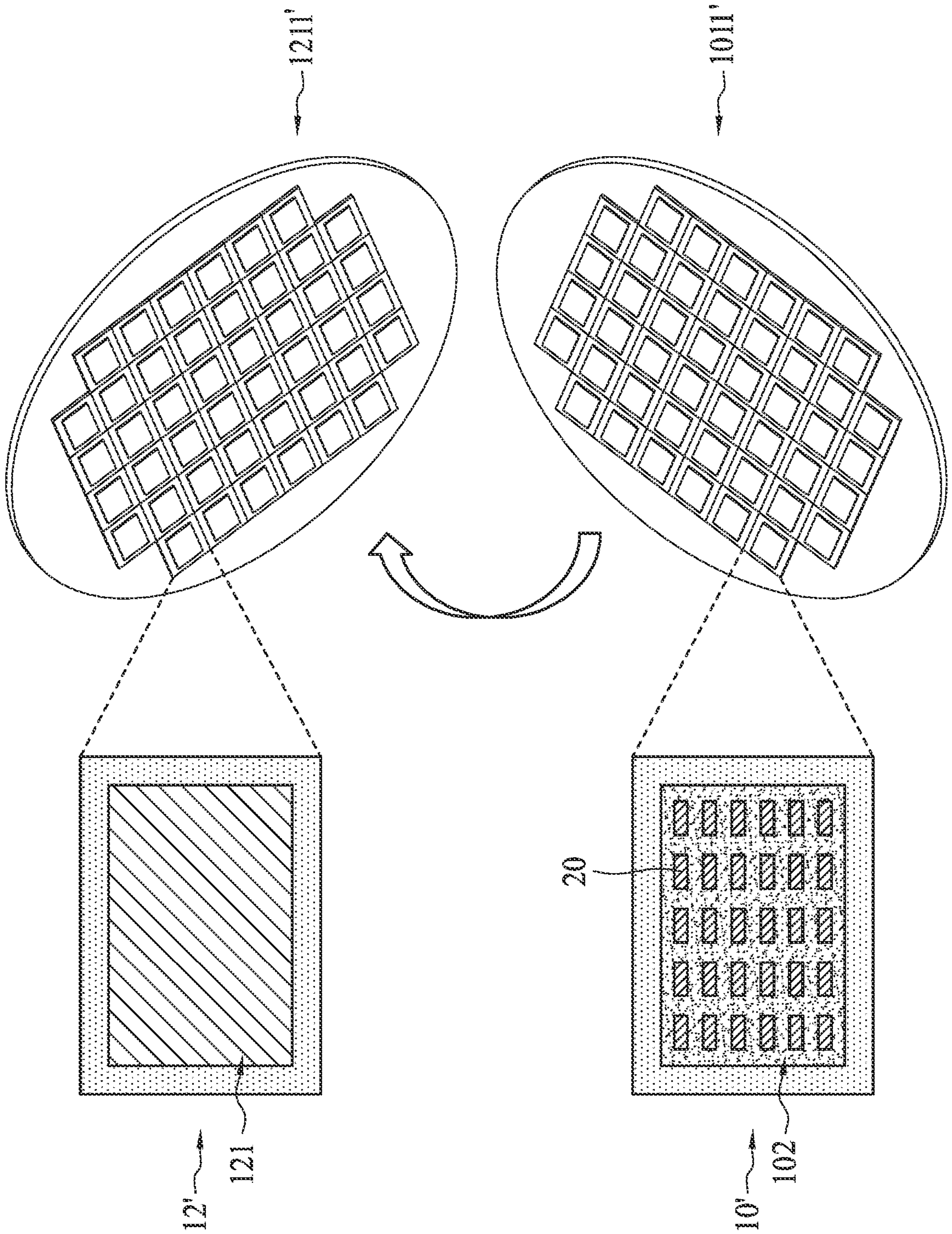
FIG. 8 illustrates a method for manufacturing an image sensing structure in accordance with some embodiments of the present disclosure.

FIG. 8 illustrates a method for manufacturing an image sensing structure 2 in accordance with some embodiments of the present disclosure. The method includes forming a plurality of first semiconductor devices 12' on a wafer 1211' and forming a plurality of second semiconductor devices 10' on a wafer 1011'. The first semiconductor devices 12' include a first unit 121. The first units 121 comprise a plurality of ADCs 28. The second semiconductor device 10' comprises a plurality of second units 102. Each of the second units 102 includes a source follower 20. The bottom side of the second semiconductor device 10' is bonded to the top side of the second semiconductor device 12' through a wafer-level bonding (e.g., the pixel level hybrid bonding 90 and 92) such that the first unit 121 of the first semiconductor device 12' corresponds to the second units 102 of the second semiconductor device 10'. The second semiconductor device 10' includes a photo sensor chip and the first semiconductor device 12' includes an ASIC chip.

Figure 9A:
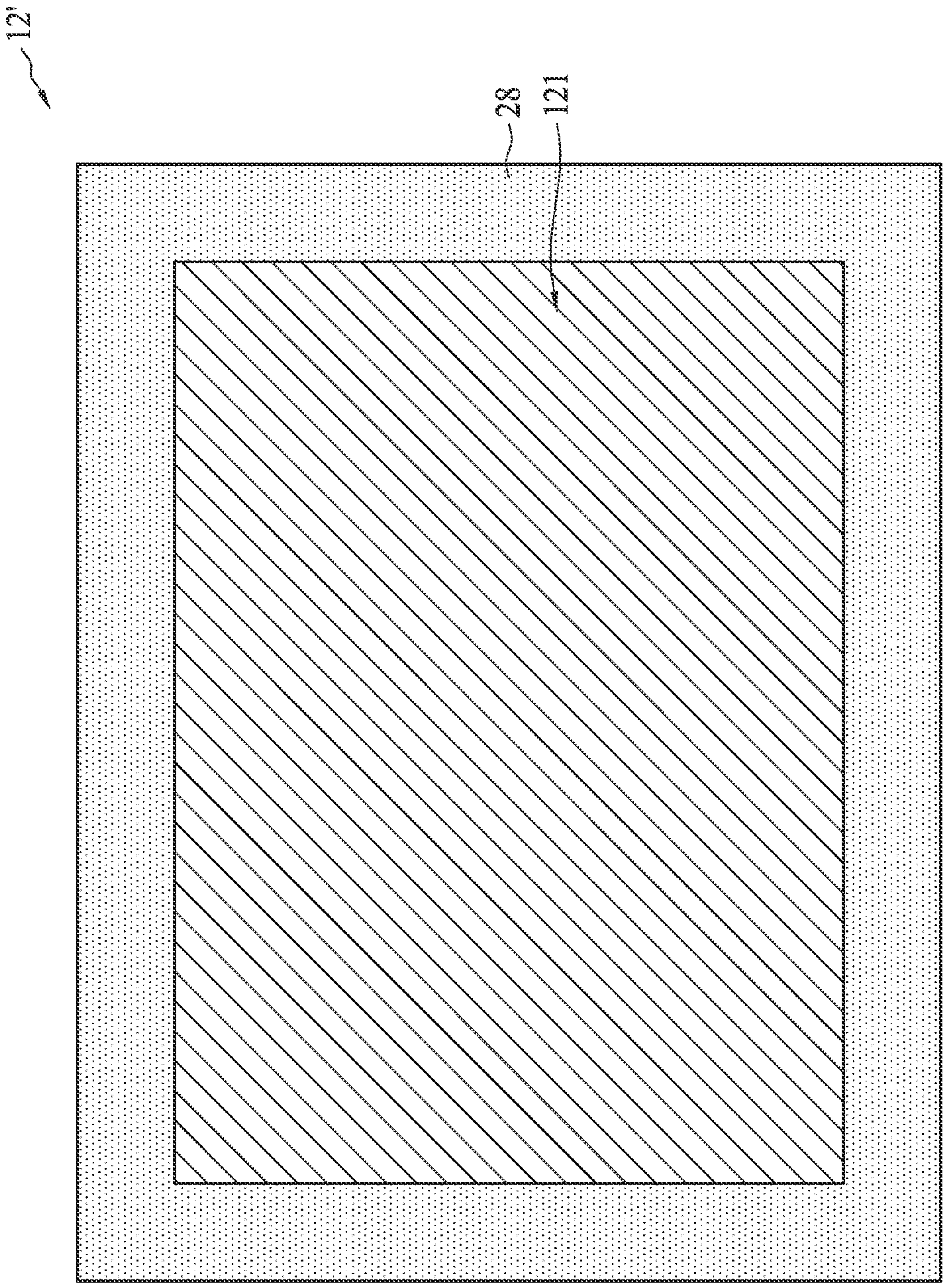
FIG. 9A is a diagram of a first semiconductor device in accordance with some embodiments of the present disclosure.

FIG. 9A is a diagram of a first semiconductor device 12' in accordance with some embodiments of the present disclosure. The first semiconductor device 12' includes a first unit 121 and the ADCs 28. The first unit 121 of the first semiconductor device 12' corresponds to the plurality of second units 102 of the second semiconductor device 10'. The first semiconductor device 12' of FIG. 9A corresponds to an operation of a rolling shutter scheme.

Figure 9B:
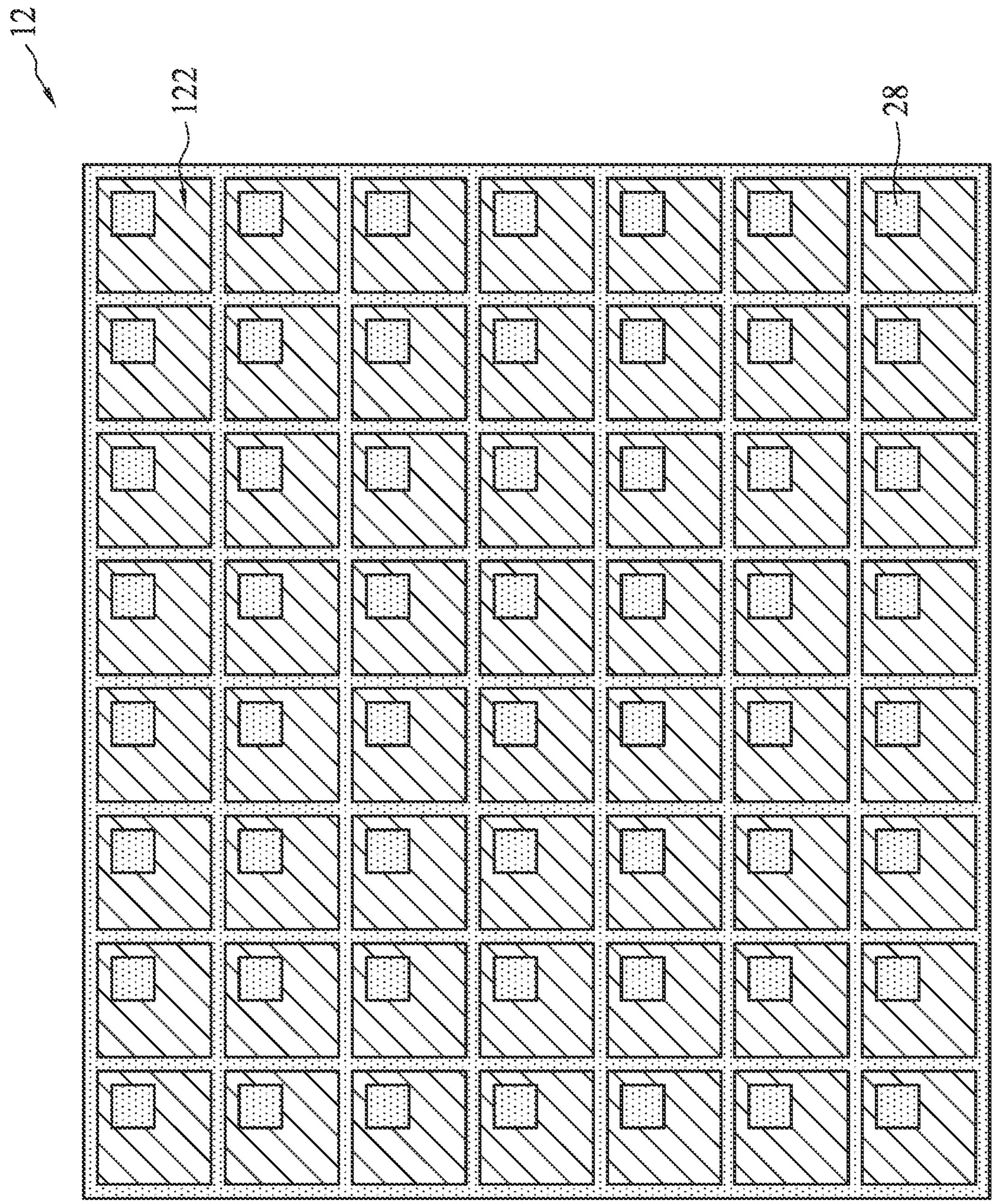
FIG. 9B is a diagram of a first semiconductor device in accordance with some embodiments of the present disclosure.

FIG. 9B is a diagram of a first semiconductor device 12 in accordance with some embodiments of the present disclosure. The first semiconductor device 12 includes a plurality of first units 122 and the plurality of ADCs 28. Each of the first units 122 includes one ADC 28 such that the first unit 122 of the first semiconductor device 12 corresponds to one second unit 102 of the second semiconductor device 10. The bottom side of the second semiconductor device 10 is bonded to the top side of the second semiconductor device 12 through a the pixel level hybrid bonding 90 and 92 such that one first unit 122 of the first semiconductor device 12 corresponds to one second unit 102 of the second semiconductor device 10. The first semiconductor device 12 of FIG. 9B corresponds to an operation of a global shutter scheme.

Figure 9C:
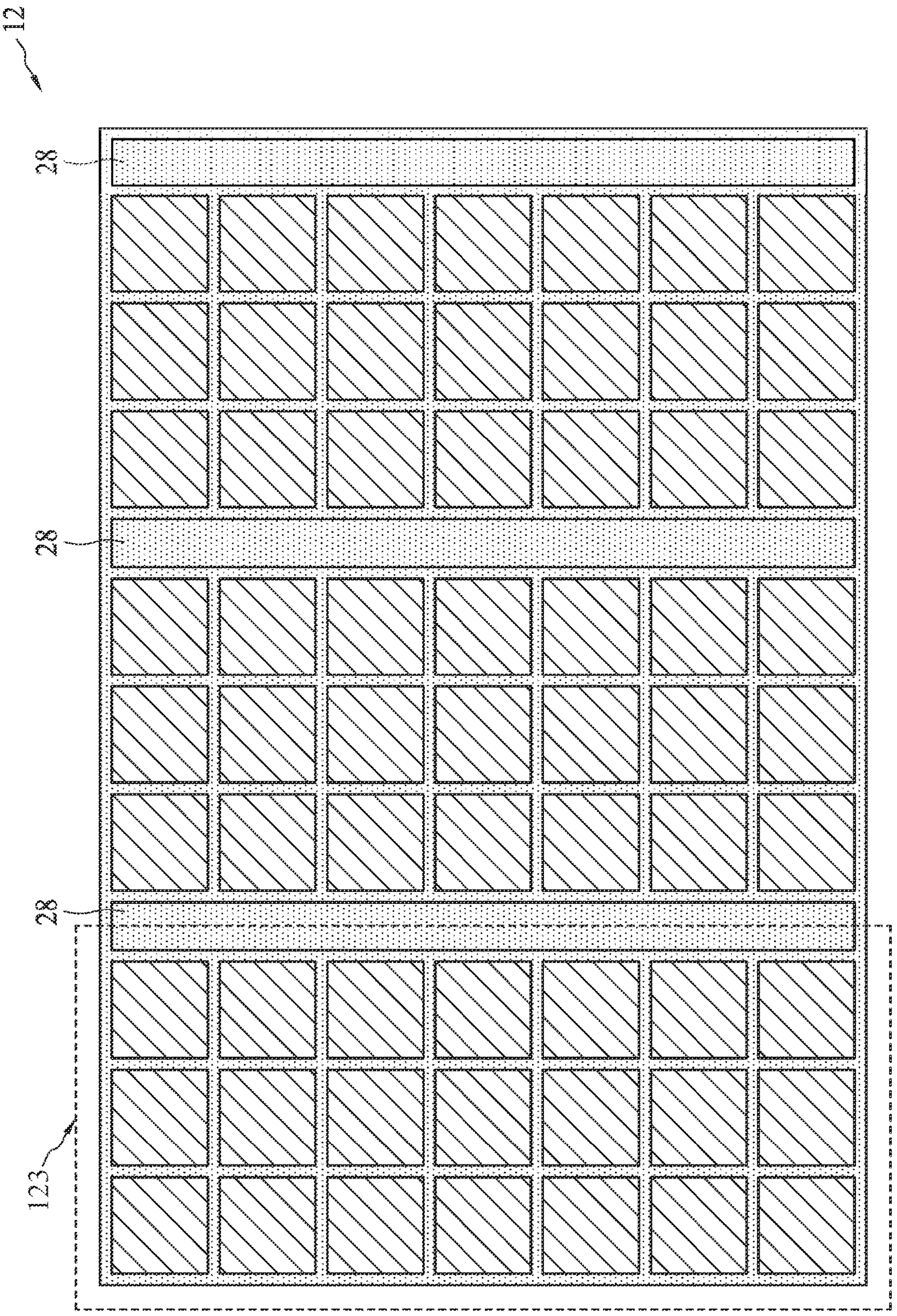
FIG. 9C is a diagram of a first semiconductor device in accordance with some embodiments of the present disclosure.

FIG. 9C is a diagram of a first semiconductor device 12 in accordance with some embodiments of the present disclosure. The first semiconductor device 12 includes a plurality of first units 123 and the plurality of ADCs 28. The plurality of first units 123 corresponds to one ADC 28 such that the plurality of first units 123 of the first semiconductor device 12 corresponds to the plurality of second units 102 of the second semiconductor device 10. The bottom side of the second semiconductor device 10 is bonded to the top side of the second semiconductor device 12 through a the pixel level hybrid bonding 90 and 92 such that the plurality of first units 123 of the first semiconductor device 12 corresponds to one ADC 28 and to the plurality of second units 102 of the second semiconductor device 10. The first semiconductor device 12 of FIG. 9C corresponds to an operation of a global shutter scheme.

Figure 10A:
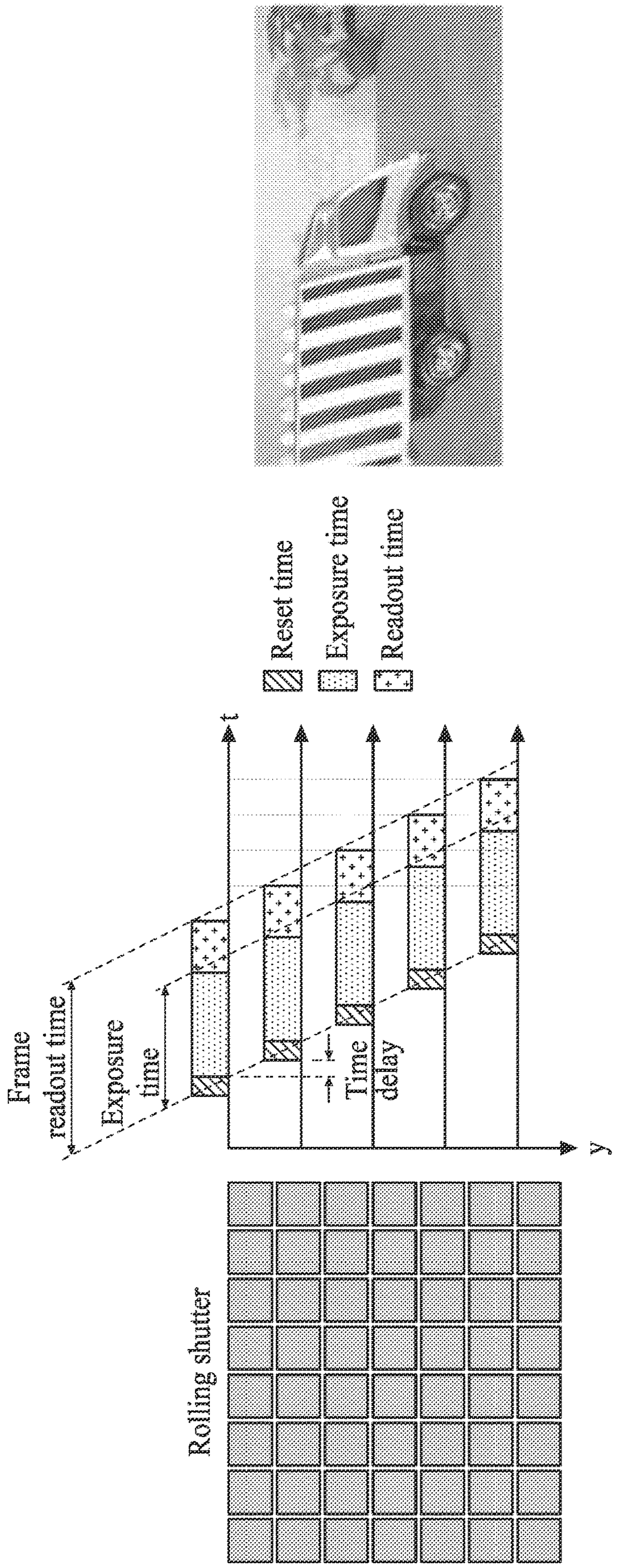
FIG. 10A is a diagram showing a rolling shutter scheme in accordance with some embodiments of the present disclosure.

FIG. 10A is a diagram showing a rolling shutter scheme in accordance with some embodiments of the present disclosure. In the rolling shutter scheme, image distortion may be caused due to the time delay of the rolling shutter scanning. The rolling shutter scanning is operated by using the row selector 26 of the second semiconductor device 10'.

Figure 10B:
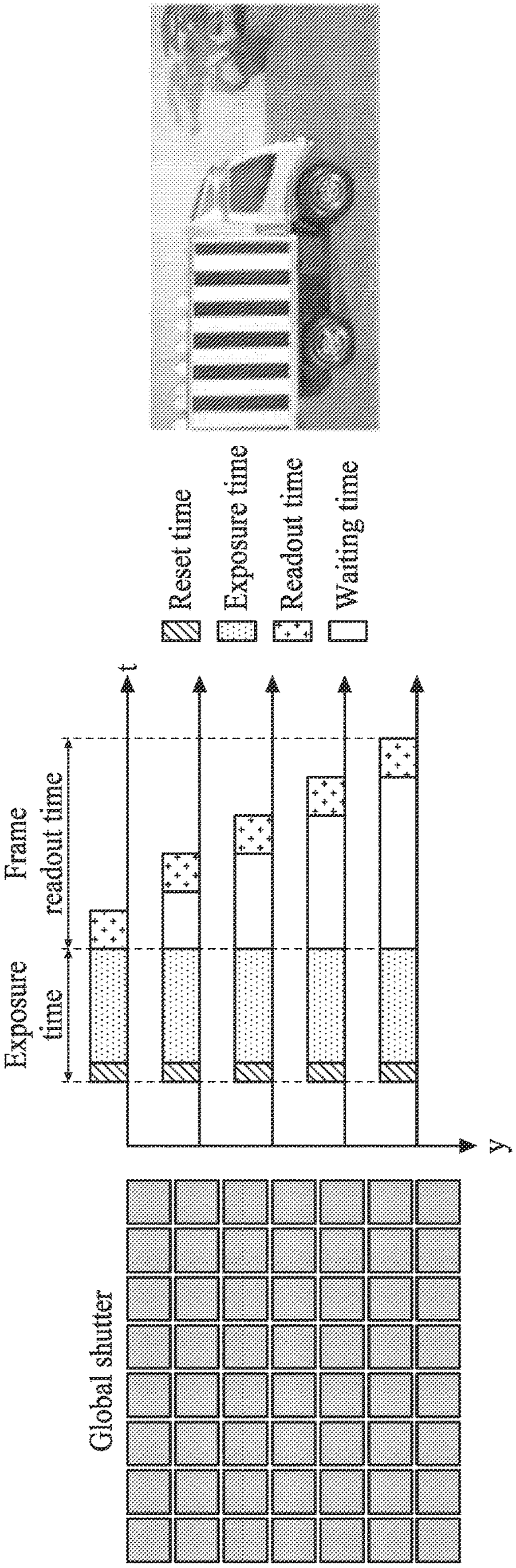
FIG. 10B is a diagram showing a global shutter scheme in accordance with some embodiments of the present disclosure.

FIG. 10B is a diagram showing a global shutter scheme in accordance with some embodiments of the present disclosure. In the global shutter scheme, no image distortion is caused since no time delay exists in the global shutter scheme. In contrast to the rolling shutter capabilities, the global shutter capabilities do not include the image distortion caused by the rolling shutter scanning. The global shutter scheme is operated using the row selector 26 in the second semiconductor device 12.

According to some embodiments, an image sensing structure includes a first semiconductor device and a second semiconductor device. The first semiconductor device includes a top side, a bottom side opposite to the top side of the first semiconductor device, and at least one first unit. The at least one first unit includes a plurality of first interconnects adjacent to the top side of the first semiconductor device, a row selector; and an analog-to-digital converter (ADC) connected to the row selectors. The second semiconductor device includes a top side, a bottom side opposite to the top side of the second semiconductor device and facing the top side of the first semiconductor device, and at least one second unit. The at least one second unit includes a photodiode facing the top side of the second semiconductor device. The photodiode is configured to receive the light incident on the top side of the second semiconductor device. The top side of the first semiconductor device is bonded to the bottom side of the second semiconductor device.

According to some embodiments, an image sensing structure comprises: a first semiconductor device comprising a top side, a bottom side opposite to the top side of the first semiconductor device, an analog-to-digital converter (ADC), and a plurality of first units, each of the plurality of first units comprising a plurality of first interconnects adjacent to the top side of the first semiconductor device, and a row selector connected to the plurality of first interconnects, wherein the analog-to-digital converter (ADC) is correspondingly connected to the plurality of first units, and a second semiconductor device comprising, a top side; a bottom side opposite to the top side of the second semiconductor device and facing the top side of the first semiconductor device, and at least one second unit comprising a photodiode adjacent to the top side of the second semiconductor device and configured to receive the light incident on the top side of the second semiconductor device, wherein the bottom side of the first semiconductor device is bonded to the top side of the second semiconductor device.

According to some embodiments, a method for manufacturing an image sensing structure includes forming a first semiconductor device, wherein the first semiconductor device comprises a top side, a bottom side opposite to the top side of the first semiconductor device, and at least one first unit, wherein the at least one first unit comprises a row selector and an analog-to-digital converter (ADC) connected to the row selectors, forming a second semiconductor device, wherein the second semiconductor device comprises a top side, a bottom side opposite to the top side of the second semiconductor device, and at least one second unit, wherein the bottom side of the second semiconductor device is bonded to the top side of the second semiconductor device.

The methods and features of the present disclosure have been sufficiently described in the foregoing examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods, and steps described in the specification. As those skilled in the art will readily appreciate from the present disclosure, processes, machines, manufacture, composition of matter, means, methods, or steps presently existing or later to be developed, that perform substantially the same function or achieve substantially the same result as the corresponding embodiments described herein, may be utilized according to the present disclosure.

Accordingly, the appended claims are intended to include within their scope processes, machines, manufacture, compositions of matter, means, methods, or steps. In addition, each claim constitutes a separate embodiment, and the combination of various claims and embodiments are within the scope of the present disclosure.

What is claimed is:

1. An image sensing structure comprising:

a first semiconductor device comprising:
- a top side;
- a bottom side opposite to the top side of the first semiconductor device; and
- at least one first unit comprising:
  - a plurality of first interconnects adjacent to the top side of the first semiconductor device;
  - a row selector; and
  - an analog-to-digital converter (ADC) connected to the row selector, wherein the ADC directly contacts a first conductive via of the plurality of first interconnects and the row selector directly contacts a second conductive via of the plurality of first interconnects, and the first conductive via and the second conductive via directly contact and are electrically connected to a conductive structure of the plurality of first interconnects; and a second semiconductor device disposed on the first semiconductor device, the second semiconductor device comprising:
- a top side;
- a bottom side opposite to the top side of the second semiconductor device and facing the top side of the first semiconductor device; and
- at least one second unit comprising:
  - a photodiode facing the top side of the second semiconductor device and configured to receive the light incident on the top side of the second semiconductor device, wherein the top side of the first semiconductor device is bonded to the bottom side of the second semiconductor device;
  - a transfer gate configured to transmit charges stored in the photodiode to a sensing node; and
  - a source follower configured to amplify a voltage of the sensing node;

wherein the second semiconductor device includes a photo sensor chip and the first semiconductor device includes an application specific integrated circuit (ASIC) chip, wherein light signals generated by the photodiode of the at least one second unit are directly transmitted to the row selector of the at least one first unit through a pixel level hybrid bonding at an interface between the top side of the first semiconductor device and the bottom side of the second semiconductor device, wherein the pixel level hybrid bonding includes a lower conductive structure disposed in the first semiconductor device and an upper conductive structure disposed in the second semiconductor device, wherein a top surface of the lower conductive structure directly contacts and is electrically connected to a bottom surface of the upper conductive structure, wherein the row selector selects a corresponding row for selecting a signal during a time period at a level in accordance with the voltage of the sensing node charged with an output current from the photodiode.

2. The image sensing structure of claim 1, wherein the top side of the first semiconductor device is bonded to the bottom side of the second semiconductor device through the pixel level hybrid bonding such that one first unit of the first semiconductor device corresponds to one or more second units of the second semiconductor device.

3. The image sensing structure of claim 1, wherein the ADC is directly electrically connected to the photodiode of the at least one second unit through the row selector and the pixel level hybrid bonding for immediate signal transfer.

4. The image sensing structure of claim 1, wherein the at least one first unit further comprises a plurality of three dimension (3D) metal insulator metal (MIM) structures.

5. The image sensing structure of claim 4, wherein the plurality of 3D MIM structures are configured to store signals detected by the photodiode.

6. The image sensing structure of claim 5, wherein the light signals generated by the photodiode of the at least one second unit are correspondingly transmitted to the ADC of the at least one first unit through the plurality of first interconnects.

7. The image sensing structure of claim 1, wherein the pixel level hybrid bonding is a pixel-level joint of the at least one first unit and the at least one second unit.

8. The image sensing structure of claim 1, wherein the transfer gate is configured as a CMOS switch.

9. The image sensing structure of claim 8, wherein the at least one second unit of the second semiconductor device further comprises a reset transistor connected to the transfer gate, wherein the reset transistor and the transfer gate share a common n-plus doped region disposed between the reset transistor and the transfer gate.

10. The image sensing structure of claim 9, wherein the source follower and the reset transistor share a common n-plus doped region disposed between the source follower and the reset transistor.

11. An image sensing structure comprising:

a first semiconductor device comprising:
- a top side;
- a bottom side opposite to the top side of the first semiconductor device; and a plurality of first units, each of the plurality of first units comprising:

a plurality of first interconnects adjacent to the top side of the first semiconductor device; and a row selector connected to the plurality of first interconnects; and an analog-to-digital converter (ADC), wherein the ADC directly contacts a first conductive via of the plurality of first interconnects and the row selector directly contacts a second conductive via of the plurality of first interconnects, and the first conductive via and the second conductive via directly contact and are electrically connected to a conductive structure of the plurality of first interconnects;

a second semiconductor device disposed on the first semiconductor device, the second semiconductor device comprising:

a top side;

a bottom side opposite to the top side of the second semiconductor device and facing the top side of the first semiconductor device; and at least one second unit comprising:

a photodiode adjacent to the top side of the second semiconductor device and configured to receive the light incident on the top side of the second semiconductor device;

a transfer gate configured to transmit charges stored in the photodiode to a sensing node; and a source follower configured to amplify a voltage of the sensing node;

wherein the top side of the first semiconductor device is bonded to the bottom side of the second semiconductor device, wherein the second semiconductor device includes a photo sensor chip and the first semiconductor device includes an application specific integrated circuit (ASIC) chip, wherein light signals generated by the photodiode of the at least one second unit are directly transmitted to the row selector of one of the plurality of first units through a pixel level hybrid bonding at an interface between the top side of the first semiconductor device and the bottom side of the second semiconductor device, wherein the pixel level hybrid bonding includes a lower conductive structure disposed in the first semiconductor device and an upper conductive structure disposed in the second semiconductor device, wherein a top surface of the lower conductive structure directly contacts and is electrically connected to a bottom surface of the upper conductive structure, wherein the row selector selects a corresponding row for selecting a signal during a time period at a level in accordance with the voltage of the sensing node charged with an output current from the photodiode.

12. The image sensing structure of claim 11, wherein the bottom side of the second semiconductor device is bonded to the top side of the first semiconductor device through the pixel level hybrid bonding.

13. The image sensing structure of claim 11, wherein the ADC is directly electrically connected to the photodiode of the at least one second unit through the pixel level hybrid bonding for immediate signal transfer.

14. The image sensing structure of claim 11, wherein the each of the plurality of first units further comprises a plurality of three dimension (3D) metal insulator metal (MIM) structures.

15. The image sensing structure of claim 14, wherein the plurality of 3D MIM structures are configured to store signals detected by the photodiode.

16. The image sensing structure of claim 15, wherein light signals generated by the photodiode are correspondingly transmitted to the ADC through the plurality of first interconnects.

17. The image sensing structure of claim 11, wherein the transfer gate is configured as a CMOS switch.

18. An image sensing structure comprising:

a first semiconductor device comprising:

a top side;

a bottom side; and at least one first unit comprising:

a plurality of first interconnects adjacent to the top side of the first semiconductor device;

a row selector electrically connected to the plurality of first interconnects; and an analog-to-digital converter (ADC) electrically connected to the row selector through the plurality of first interconnects, wherein the ADC directly contacts a first conductive via of the plurality of first interconnects and the row selector directly contacts a second conductive via of the plurality of first interconnects, and the first conductive via and the second conductive via directly contact and are electrically connected to a conductive structure of the plurality of first interconnects; and a second semiconductor device disposed on the first semiconductor device, the second semiconductor device comprising:

a top side;

a bottom side facing the top side of the first semiconductor device; and at least one second unit comprising:

a photodiode disposed in the second semiconductor device and configured to receive the light incident on the top side of the second semiconductor device;

a transfer gate configured to transmit charges stored in the photodiode to a sensing node; and a source follower configured to amplify a voltage of the sensing node;

wherein the top side of the first semiconductor device is bonded to the bottom side of the second semiconductor device through a pixel level hybrid bonding such that one first unit of the first semiconductor device corresponds to one or more second units of the second semiconductor device, wherein the second semiconductor device includes a photo sensor chip and the first semiconductor device includes an application specific integrated circuit (ASIC) chip, wherein light signals generated by the photodiode of the at least one second unit are directly transmitted to the row selector of the at least one first unit through a pixel level hybrid bonding at an interface between the top side of the first semiconductor device and the bottom side of the second semiconductor device, wherein the row selector of the at least one first unit is directly electrically connected to the photodiode of the at least one second unit to control the light signals from the photodiode, wherein the pixel level hybrid bonding includes a lower conductive structure disposed in the first semiconductor device and an upper conductive structure disposed in the second semiconductor device, wherein a top surface of the lower conductive structure directly contacts and is electrically connected to a bottom surface of the upper conductive structure, wherein the row selector selects a corresponding row for selecting a signal during the time period at a level in accordance with the voltage of the sensing node charged with an output current from the photodiode.

19. The image sensing structure of claim 18, wherein the transfer gate is configured as a CMOS switch.

20. The image sensing structure of claim 18, wherein the at least one first unit further comprises a plurality of three dimension (3D) metal insulator metal (MIM) structures.

* * * * *